United States Patent
Markoya et al.

(10) Patent No.: US 7,751,030 B2
(45) Date of Patent: Jul. 6, 2010

(54) INTERFEROMETRIC LITHOGRAPHIC PROJECTION APPARATUS

(75) Inventors: Louis Markoya, Sandy Hook, CT (US); Aleksandr Khmelichek, Brooklyn, NY (US); Diane C. McCafferty, Sandy Hook, CT (US); Harry Sewell, Ridgefield, CT (US); Justin L. Kreuzer, Trumbull, CT (US)

(73) Assignee: ASML Holding N.V., Veldhoven (NL)

( * ) Notice: Subject to any disclaimer, the term of this patent is extended or adjusted under 35 U.S.C. 154(b) by 277 days.

(21) Appl. No.: 11/341,381

(22) Filed: Jan. 30, 2006

(65) Prior Publication Data

US 2006/0170896 A1     Aug. 3, 2006

Related U.S. Application Data

(60) Provisional application No. 60/648,388, filed on Feb. 1, 2005.

(51) Int. Cl.
G03B 27/54     (2006.01)

(52) U.S. Cl. .............................. 355/67; 359/577; 355/53

(58) Field of Classification Search ................... 355/53, 355/55, 67, 22, 71; 430/5; 359/31, 577
See application file for complete search history.

(56) References Cited

U.S. PATENT DOCUMENTS

| | | |
|---|---|---|
| 4,560,249 A | 12/1985 | Nishiwaki et al. |
| 4,596,467 A | 6/1986 | Bartelt |
| 4,792,197 A | 12/1988 | Inoue et al. |
| 4,806,454 A | 2/1989 | Yoshida et al. |
| 5,142,385 A | 8/1992 | Anderson et al. |
| 5,414,835 A | 5/1995 | Iijima |
| 5,640,239 A | 6/1997 | Takamiya et al. |
| 5,705,321 A | 1/1998 | Brueck et al. |
| 5,759,744 A | 6/1998 | Brueck et al. |
| 5,771,098 A | 6/1998 | Ghosh et al. |
| RE36,113 E | 2/1999 | Brueck et al. |
| 6,013,396 A | 1/2000 | Capodieci |
| 6,178,000 B1 | 1/2001 | Hoffnagle |

(Continued)

FOREIGN PATENT DOCUMENTS

EP     0243520 B1     11/1991

(Continued)

OTHER PUBLICATIONS

Machine translation of JP 07-159609-A, translation retrieved Aug. 7, 2009.*

(Continued)

*Primary Examiner*—Hung Henry Nguyen
*Assistant Examiner*—Steven H Whitesell-Gordon
(74) *Attorney, Agent, or Firm*—Pillsbury Winthrop Shaw Pittman LLP

(57) ABSTRACT

A lithographic projection apparatus includes an illumination system, an interchangeable upper optics module, and a lower optics module. The illumination system provides a beam of radiation. The interchangeable upper optics module receives the beam and includes, sequentially, a beam splitter that splits the beam into portions, an aperture plate, and a plurality of reflecting surfaces. The lower optics module receives portions of the beam from respective ones the reflecting surfaces and directs the portions of the beam onto a substrate. Interference fringes or contact hole patterns are formed on the substrate using the portions of the beam.

25 Claims, 12 Drawing Sheets

U.S. PATENT DOCUMENTS

| | | | |
|---|---|---|---|
| 6,185,019 B1 | 2/2001 | Hobbs et al. | |
| 6,233,044 B1 | 5/2001 | Brueck et al. | |
| 6,249,335 B1 * | 6/2001 | Hirukawa et al. | 355/53 |
| 6,304,318 B1 | 10/2001 | Matsumoto | |
| 6,556,280 B1 | 4/2003 | Kelsey et al. | |
| 6,830,850 B1 | 12/2004 | Krivokapic et al. | |
| 6,847,457 B2 * | 1/2005 | Tobiason et al. | 356/495 |
| 6,882,477 B1 | 4/2005 | Schattenburg et al. | |
| 2001/0021487 A1 | 9/2001 | Williams et al. | |
| 2001/0035991 A1 | 11/2001 | Hobbs et al. | |
| 2002/0030802 A1 | 3/2002 | Sugita et al. | |
| 2002/0031725 A1 | 3/2002 | Sugita et al. | |
| 2002/0134985 A1 | 9/2002 | Chen et al. | |
| 2002/0149751 A1 | 10/2002 | Bloomstein et al. | |
| 2002/0149757 A1 | 10/2002 | Kelsey et al. | |
| 2002/0149849 A1 | 10/2002 | Kelsey et al. | |
| 2003/0043356 A1 * | 3/2003 | Shiraishi | 355/53 |
| 2003/0048523 A1 * | 3/2003 | Gerstenberger et al. | 359/328 |
| 2003/0098979 A1 | 5/2003 | Dress et al. | |
| 2003/0147082 A1 | 8/2003 | Goldstein | |
| 2004/0042724 A1 | 3/2004 | Gombert et al. | |
| 2004/0075895 A1 * | 4/2004 | Lin | 359/380 |
| 2004/0110092 A1 | 6/2004 | Lin | |
| 2005/0012933 A1 | 1/2005 | Matthews | |
| 2005/0057735 A1 | 3/2005 | Smith | |
| 2005/0064297 A1 | 3/2005 | Wago | |
| 2005/0073671 A1 | 4/2005 | Borodovsky | |
| 2005/0074698 A1 | 4/2005 | Borodovsky | |
| 2005/0088633 A1 | 4/2005 | Borodovsky | |
| 2005/0094152 A1 | 5/2005 | Allen | |
| 2005/0105100 A1 | 5/2005 | Swindal | |
| 2005/0168717 A1 | 8/2005 | Hinsberg, III et al. | |
| 2006/0044539 A1 | 3/2006 | Markoya et al. | |

FOREIGN PATENT DOCUMENTS

| | | | |
|---|---|---|---|
| JP | 61-190368 A | 8/1986 |
| JP | 3-263313 A | 11/1991 |
| JP | 4-163461 A | 6/1992 |
| JP | 5-072408 A | 3/1993 |
| JP | 5-217856 A | 8/1993 |
| JP | 6-053122 A | 2/1994 |
| JP | 6-053122 U | 7/1994 |
| JP | 07-159609 A | 6/1995 |
| JP | 10-270330 A | 10/1998 |
| JP | 2000-021716 A | 1/2000 |
| JP | 2000-021720 A | 1/2000 |
| JP | 2000-040656 A | 2/2000 |
| JP | 2000-223400 A | 8/2000 |
| JP | 2001-007020 A | 1/2001 |
| JP | 2001-223149 A | 8/2001 |
| JP | 2002-162750 A | 6/2002 |
| JP | 2004-014866 A | 1/2004 |
| JP | 2004-014867 A | 1/2004 |
| JP | 2004-317922 A | 11/2004 |
| JP | 2005-026649 A | 1/2005 |
| JP | 2005-099537 A | 4/2005 |
| JP | 2005-134873 A | 5/2005 |
| KR | 9401227 B1 | 2/1994 |
| WO | WO 98/18049 A1 | 4/1998 |
| WO | WO 2004/003611 A1 | 1/2004 |
| WO | WO 2004/088363 A1 | 10/2004 |

OTHER PUBLICATIONS

English Translation of Japanese Official Action issued on Jan. 23, 2009 in Japanese Application No. 2006-021608.

* cited by examiner

INTERFEROMETRIC LITHOGRAPHIC PROJECTION APPARATUS

CROSS REFERENCE TO RELATED APPLICATIONS

This application claims priority to U.S. Provisional Patent Application No. 60/648,388, filed Feb. 1, 2005, which is incorporated by reference herein in its entirety.

BACKGROUND

1. Field of the Invention

The present invention relates to lithographic projection apparatus and more particularly, to interferometric lithographic projection apparatus (both immersion and non-immersion).

2. Related Art

Usually a lithographer, when printing test line patterns (or test contact hole patterns), prefers to print several sets of lines, starting with the finest resolution, and ending with the larger lines and/or contact holes. This is because the resolution of the overall semiconductor manufacturing process depends not only on the optics involved, but also on the chemical processes, and the interactions between the photoresist, and the etching chemicals, etc. Thus, a lithographer often needs to know at which resolution the etching of the photoresist begins to break down.

When resolutions reach nanometer scale, such as 30-100 nm, it is very difficult to use conventional masks and reticles to accomplish this. Also, utilizing a conventional lithographic projection apparatus, that uses reticles and lenses is extremely expensive, since such projection apparatus, particularly projection apparatus at the extreme limits of resolution often cost in the range of $5 to $20 million. The current resolution limit of lens-based lithographic projection apparatus is approximately 65 nm, and even reaching this resolution is considered a difficult accomplishment at the current state of the art.

Many of the current lithographic projection apparatus available for interferometric lithographic printing may be better in printing at a resolution lower than conventional lithography projection apparatus however interference lithography projection apparatus are not capable of printing different patterns at different resolutions.

Accordingly, there is a need in the art for an interferometric lithographic projection apparatus that has the ability to print multiple patterns.

SUMMARY

In one embodiment of the present invention, a lithographic projection apparatus, comprising: an illumination system that conditions a beam of radiation; an interchangeable upper optics module that receives the beam and comprises a beam splitter, which splits the beam into multiple beam portions; and, a lower optics module for receiving the beam portions and directing the beam portions onto a same location on a substrate so as to create an interference pattern on the substrate, wherein at least one of the interchangeable upper optics module and the lower optics module is provided with reflecting surfaces for directing the beam portions to the same location and the interchangeable upper optics module is interchangeable for a different interchangeable upper optics module so as to change the interference pattern is provided It must be understood that the term upper optics module and lower optics module doesn't necessarily mean that the lower optics module should be located underneath the upper optics module. It only means that the upper optics module is located before the lower optics module in a optical sense so that the beam first passes through the upper optics module before reaching the lower optics module.

In one example, the beamsplitter generates zeroth, first, and higher order diffraction patterns. In this example, an aperture plate provided to the interchangeable upper optics blocks the zeroth order diffraction pattern, and optionally higher order diffraction patterns.

In one example, an immersion liquid can be used between the lower optics module and the substrate.

In various examples, the beamsplitter can include a linear grating, a checkerboard grating, a basket weave grating, or an etched face basket weave grating.

In one example a lithographic projection apparatus, comprising: an illumination system that conditions a beam of radiation; an interchangeable upper optics module that receives the beam and comprises a beam splitter, which splits the beam into multiple beam portions; and a lower optics module for receiving at least four beam portions and directing the beam portions onto a same location on a substrate so as to create a two dimensional interference pattern on the substrate wherein at least one of the interchangeable upper optics module and the lower optics module is provided with reflecting surfaces for directing the beam portions to the same location and the interchangeable upper optics module is interchangeable for a different interchangeable upper optics module so as to change the interference pattern is provided.

In another example a lithographic projection apparatus, comprising: an illumination system that conditions a beam of radiation; a plurality of interchangeable upper optics modules that are swapped into a path of the beam under computer control, each interchangeable upper optics module being provided with a beam splitter, which splits the beam into multiple beam portions; and a lower optics module for receiving the beam portions and directing the beam portions onto a same location on a substrate so as to create an interference pattern on the substrate, wherein at least one of the interchangeable upper optics module and the lower optics module is provided with reflecting surfaces for directing the beam portions to the same location and the interchangeable upper optics module is interchangeable for a different interchangeable upper optics module so as to change the interference pattern is provided.

It is to be understood that both the foregoing general description and the following detailed description are exemplary and explanatory and are intended to provide further explanation of the invention as claimed.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 6A, 6B, 6C, and 6D illustrate sample gratings that may be used as beam splitters, according to various embodiments of the present invention.

Figure 6A:
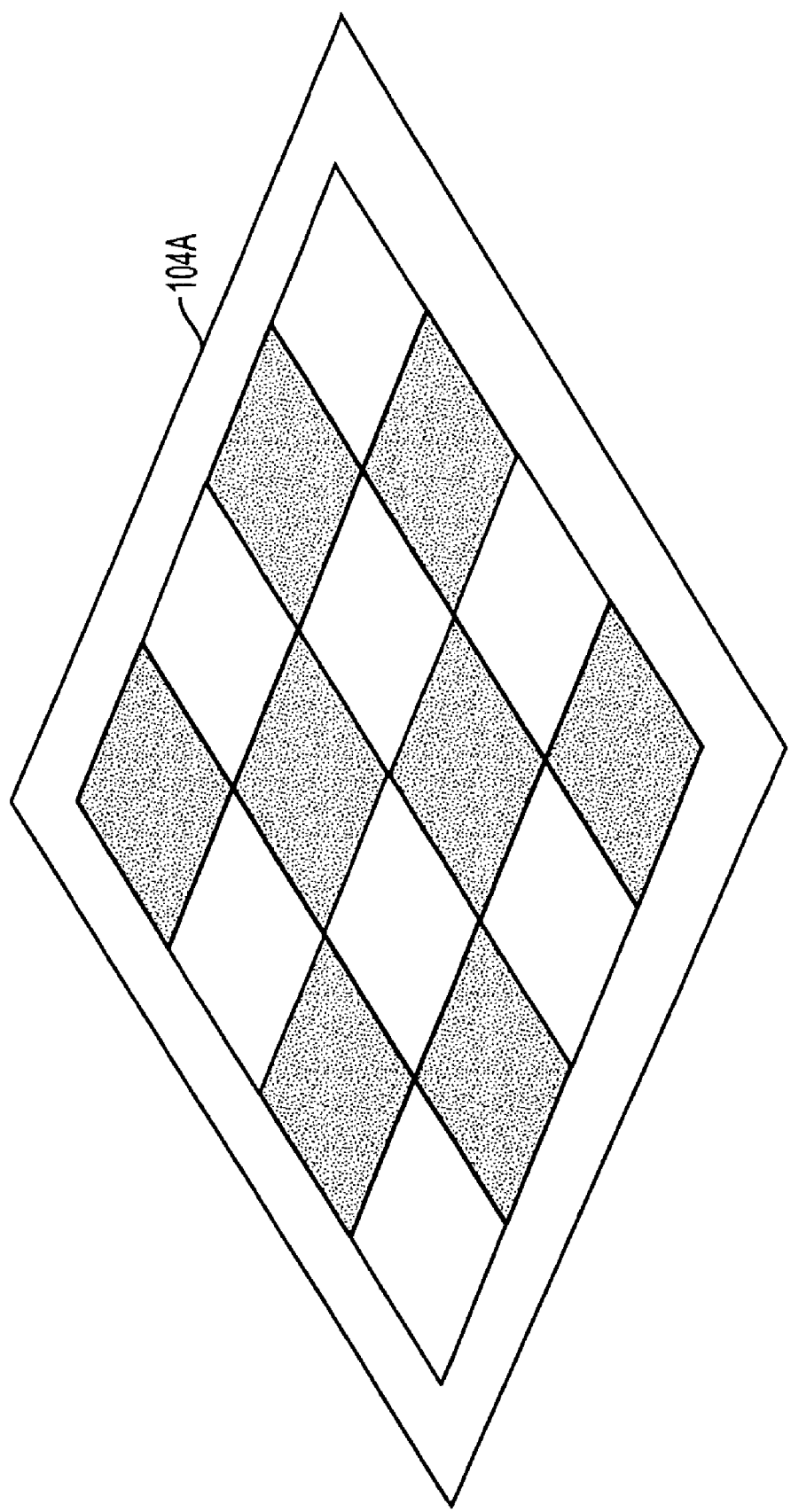
Figure 6B:
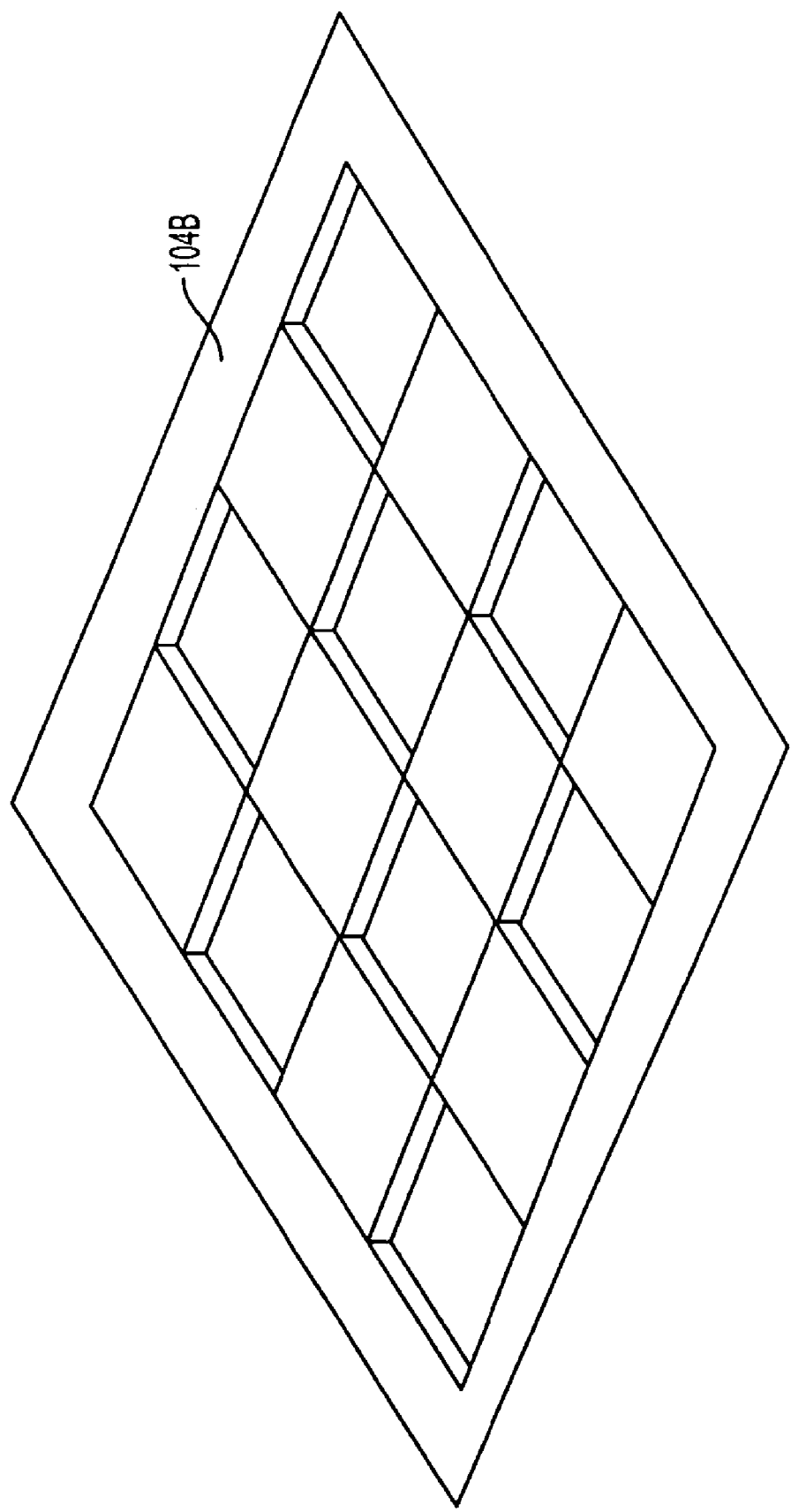
Figure 6C:
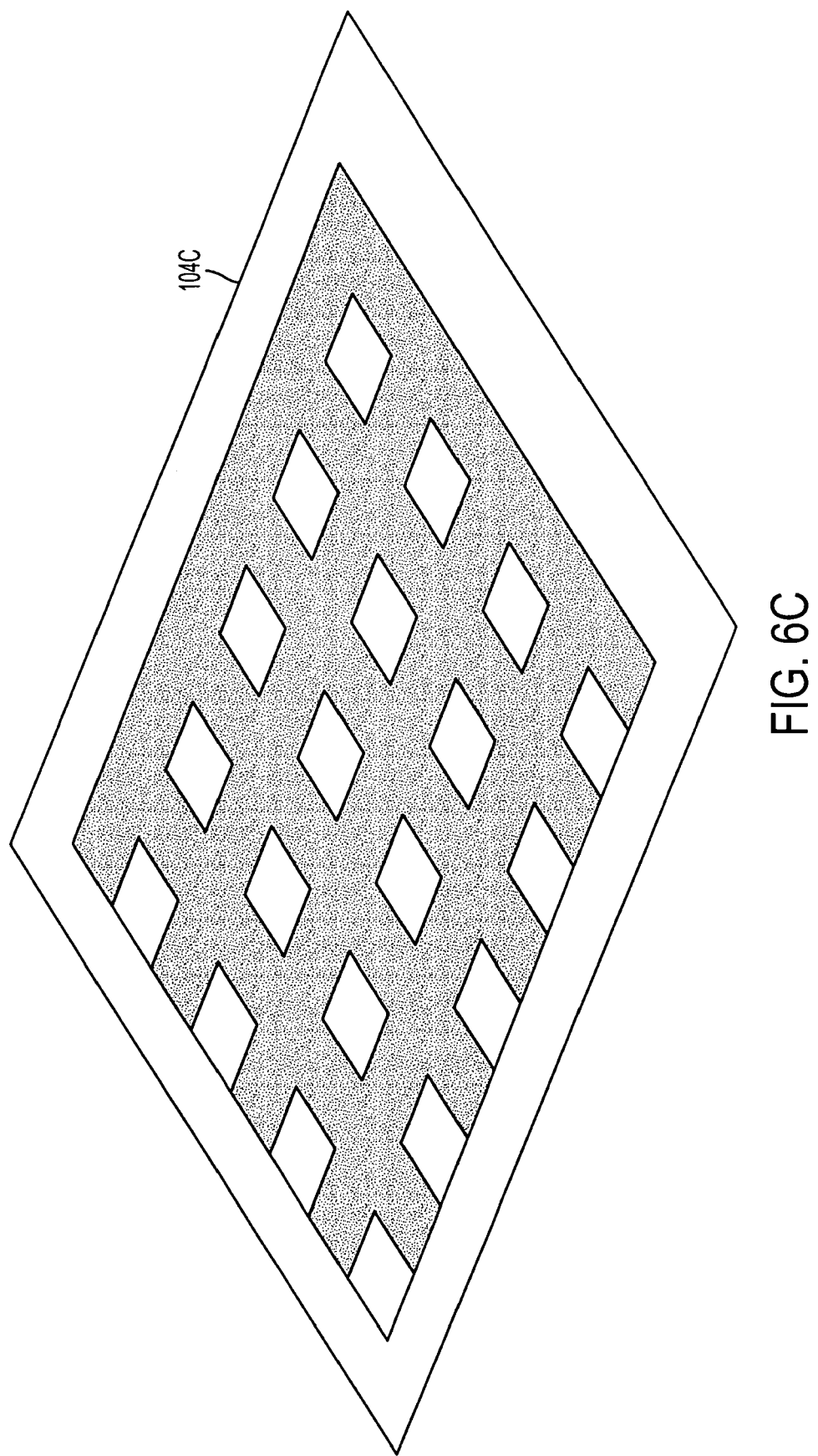
Figure 6D:
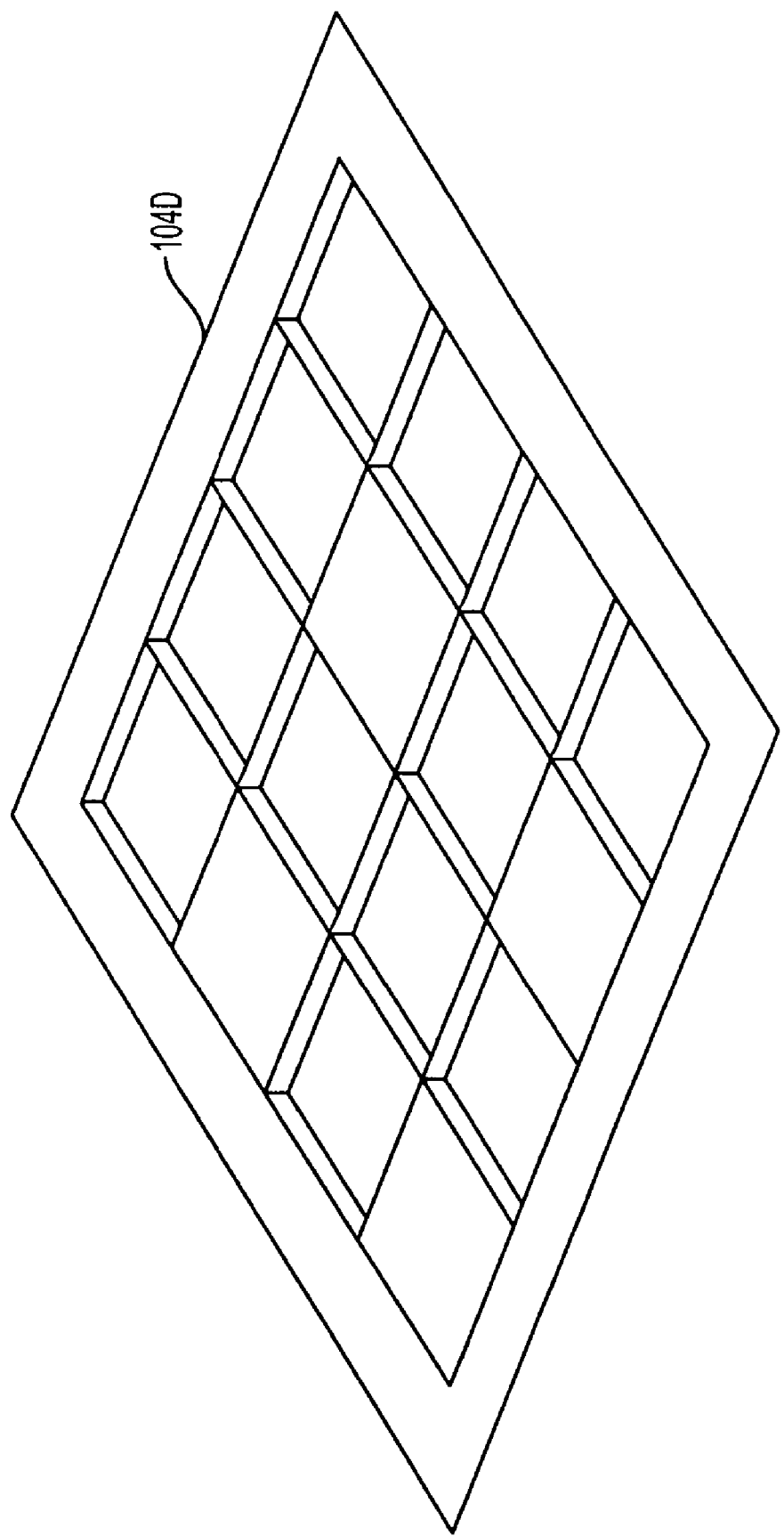
Figure 7:
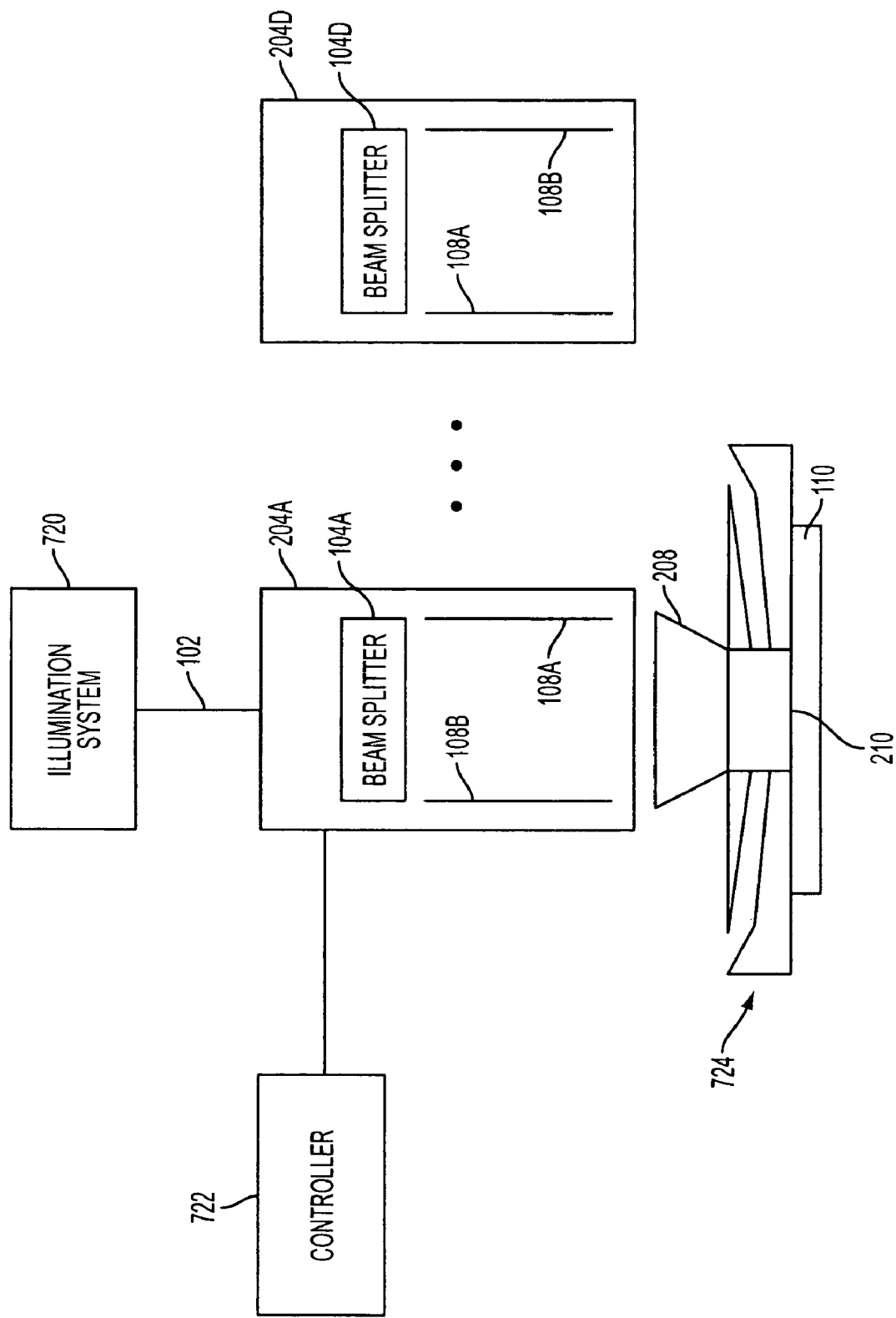

FIG. 7 illustrates an exemplary lithographic projection apparatus where the gratings of FIGS. 6A-6D may be used, according to one embodiment of the present invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
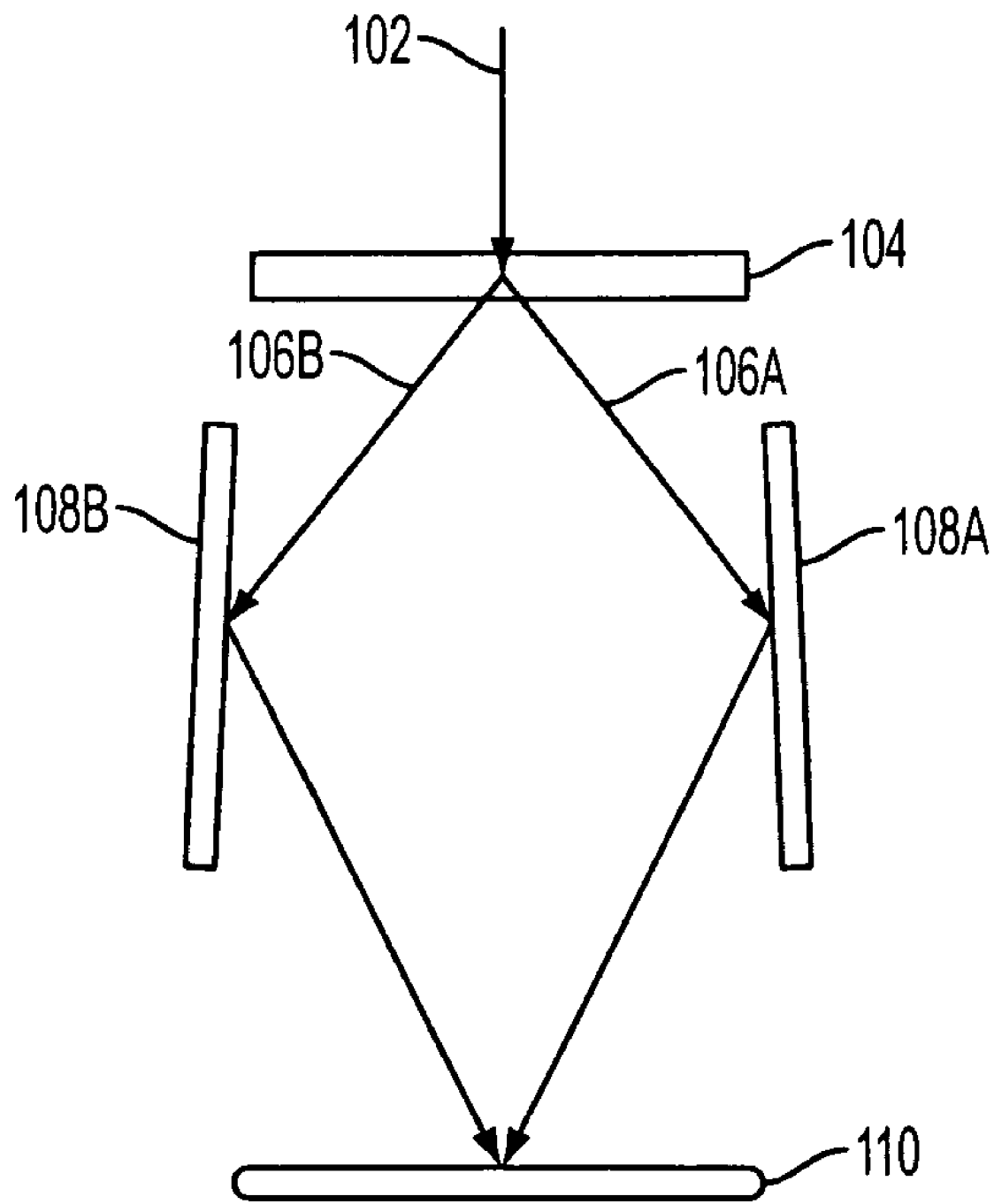
FIG. 1 illustrates a conventional interferometric lithographic projection apparatus.

FIG. 1 illustrates a conventional interferometric lithographic projection apparatus, sometimes known as a Talbot interferometer, which is used for printing, or forming, line patterns on a substrate. Shown in FIG. 1 is a coherent light beam 102, normally generated by a laser, which is incident on a beam splitter 104. The beam splitter 104 separates the beam 102 into two beams, 106A and 106B. The two beams 106A and 106B are then reflected off reflecting surfaces 108A and 108B respectively, and then redirected towards a substrate 110. Substrate 110 is normally in the focal plane of the projection apparatus, and an interference pattern is formed at the substrate 110. The interference pattern exposes a photoresist layer (not labeled in FIG. 1), and forms a line pattern, which is similar to a grating.

Photoresist manufacturers may need to test resist for its performance at various line geometries, as well as various contact hole geometries. This can be because the chemistry of etching is more complex in the case of printing contact holes than in the case of printing lines. In other words, the manufacturers of the photoresist need to test the ability of the resist to form the contact holes (vias) at very fine resolutions.

Figure 2:
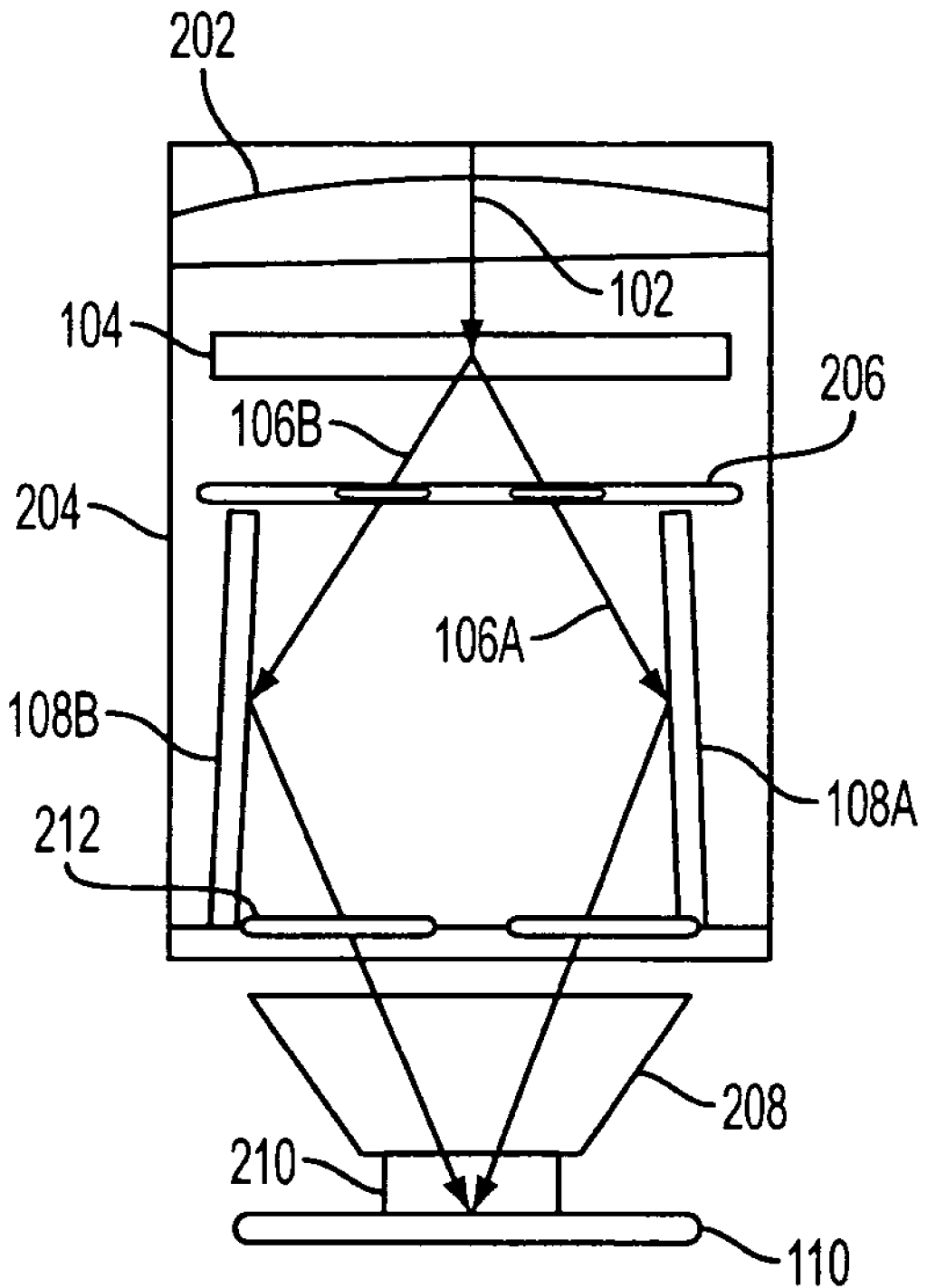
FIG. 2 illustrates one embodiment of the invention.

FIG. 2 illustrates one embodiment of the present invention. As shown in FIG. 2, an optics module for an interferometric lithographic projection apparatus is divided into two modules, an interchangeable upper optics module 204 and a lower optics module 208.

In one example, the lower optics module 208 is permanently mounted in place, so that it can interface with a liquid 210 (or an air gap, if a non-immersion interferometric lithographic projection apparatus is used) and with a wafer (or substrate) 110. In other words, in the example shown, the lower optics module 208 is intended to be aligned once, and then left in place.

The interchangeable upper optics module 204 may be placed, for example, on a carousel, or a slider to interchange it when necessary. In one example, the interchangeable upper optics module 204 includes beam conditioning optics 202, a beam splitter 104, an aperture plate 206, reflecting surfaces 108A and 108B, and a polarizer plate 212. The beam splitter 104 diffracts zeroth, first, and higher order diffraction beam portions. The aperture plate 206 can be used to block the zeroth order and, optionally, the higher order diffraction beam portions, leaving only the first order beam portions 106A and 106B that are incident on the reflecting surfaces 108A and 108B.

Thus, this embodiment of the present invention can provide the ability to maintain an immersion liquid between a substrate (wafer) and the lower optics module, while changing the printing configuration of the lithographic projection apparatus by changing the interchangeable upper optics module. The fluid interface between optics and the wafer need not be affected. In various examples, the change of the printing configuration permits for easy variations in contact hole characteristics, line width characteristics, changing the line/space ratio, etc.

In one example, the lowest index of refraction among the components (e.g., beam splitter, prism optics, immersion fluid, and photoresist) can be the limiting factor in achieving the smallest possible resolution.

However, in some Talbot interferometers the interference pattern can be unstable. This is because the mirrors required for a Talbot interferometer need to be maintained in very precise alignment relative to each other and to the surface being exposed. Thus, in this embodiment of the present invention, many of the components are located in a "solid" optical module, such that the components do not move relative to each other. This is illustrated by module 204 in FIG. 2. In the example shown, in order to maintain the fluid interface between the optics and the wafer 110, the optics have been divided into two portions, upper and lower optics modules 204 and 208. In one example, upper module 204 is replaceable and lower module 208 is meant to remain in a fixed position.

In one example, the upper module 204 may also be used to change the contrast. Typically, when interferometric printing is performed, the contrast is very sharp. However, there may be reasons for deliberately degrading the contrast. The interchangeable upper optics module 204 may be used to provide both high contrast and low contrast.

Figure 3:
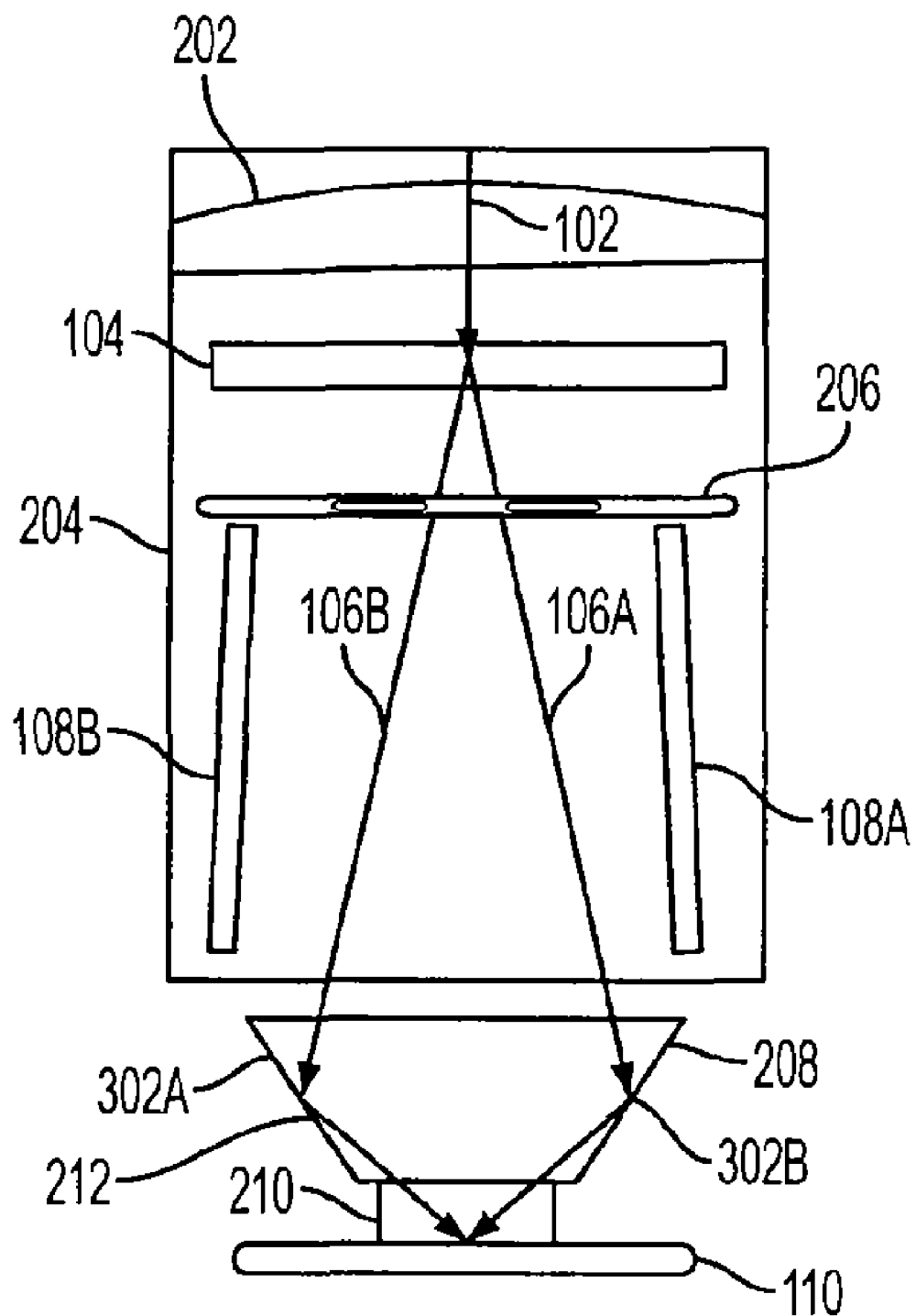
FIG. 3 illustrates another embodiment of the invention where a high resolution is desired.

FIG. 3 illustrates one embodiment of the present invention, in which a high resolution is desired. As may be seen in FIG. 3, instead of reflecting at lower acute angles off the surfaces 108, as is shown in the embodiment of FIG. 2, the beams 106 reflect at high acute angles off reflecting surfaces 302A and 302B which may be reflective surfaces of a prism of the lower module 208. Forming the reflective surfaces on a prism has the advantage that the position of the reflective surfaces with respect to each other is very stable ensuring a good and stable alignment of the reflective surfaces. Thus, to produce high resolution the beam angles are more acute and are reflected off surface 302A and 302B, while to produce medium resolution the beam angles are less acute and beams are reflected within the interchangeable upper optics module 204 and pass straight through the lower module 208. To change the angles to produce different resolution the interchangeable upper optics module may be changed while the lower optics module and the illumination system stay the same.

In one example, the aperture plate 206 may be used to include or exclude desired orders of diffraction. For example, the zeroth order diffraction may be blocked, or the orders of diffraction higher than the first order may be blocked, etc.

In one example, another parameter that may need to be changed is the polarization of the beam. Polarization is often important, because TE mode polarization gives the best image contrast, and TM mode polarization gives the worst image contrast. Thus, a polarizer plate, such as element 212 shown in FIG. 2, may be used to define beam polarization. In one example, a designer may want to change the balance between TE and TM mode polarizations.

In one example, it may be desirable to change the symmetry of the beam, for example, from two-way symmetry to four-way symmetry, while still maintaining the fluid interface.

It will be appreciated that some or all of the components shown in, for example, FIG. 2 as part of the interchangeable upper optics module 204, may be present in some of the modules, and absent from others, depending on the desired printing task.

In one example, the lower optics module 208 may include, for example, a multi-faceted prism, such as described in commonly owned, co-pending U.S. patent application Ser. No. 10/927,309, entitled "Adjustable Resolution Interferometric Lithographic System," which is incorporated herein by reference in its entirety.

With regards to polarization of the laser beam 102, polarization becomes more important as the resolution becomes finer and finer. For example, in the lithographic projection apparatus shown in FIG. 2, for a four-way symmetric beam, polarization is not a significant issue if the contact holes are on the order of 100 nm in diameter. It will be understood, that all four beams have a common polarization component in order to create the interference pattern. However, most polarization orientations are useable at larger resolutions, e.g., on the order of 100 nm. However, the sensitivity to polarization increases as the resolution becomes finer. Thus, at finer resolutions, it is even more important to have a common polarization component for all four beams. In other example, in addition to linear polarization (e.g., TE, TM, or a combination of the two) circular polarization or elliptical polarization may be used.

Figure 4A:
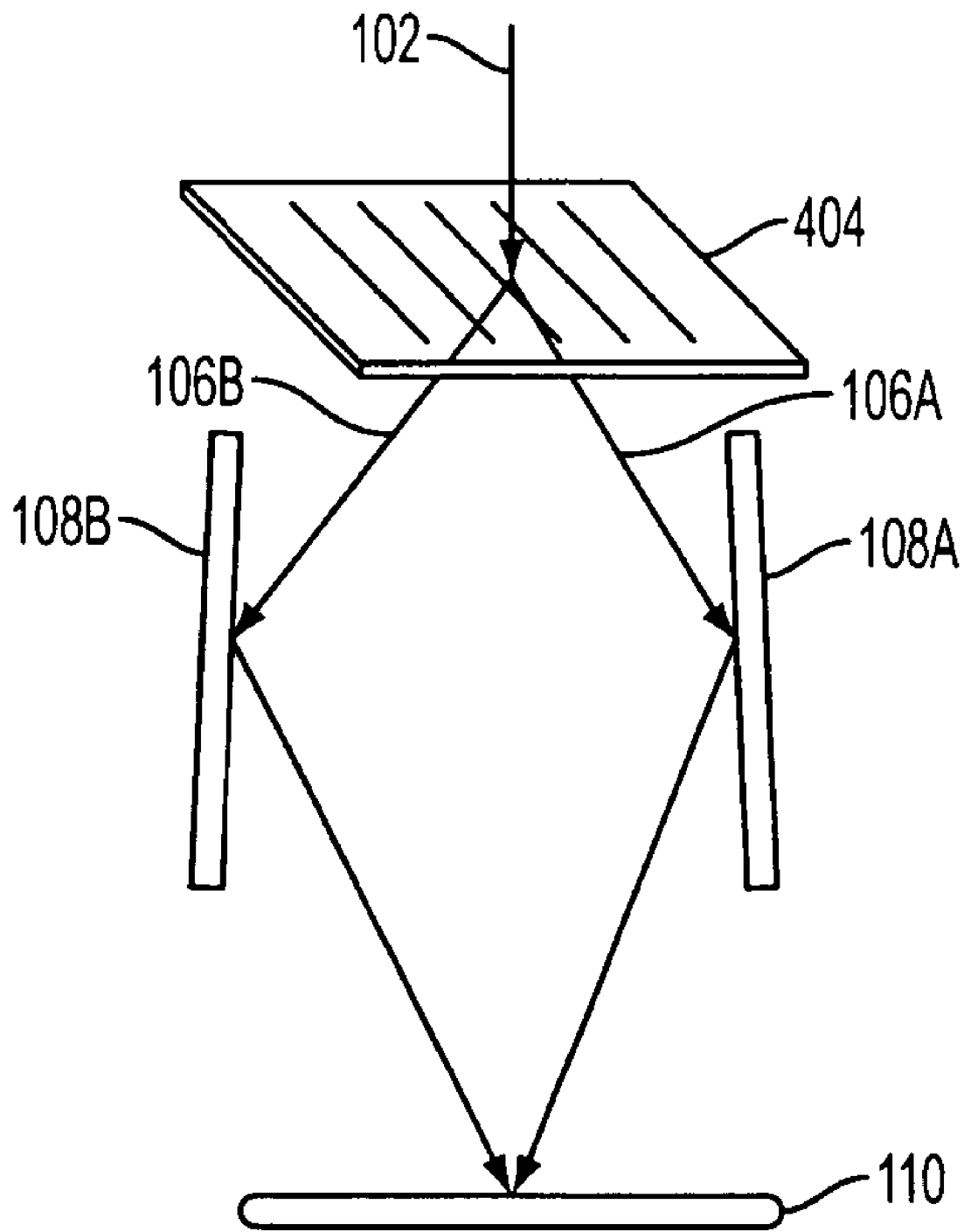
FIGS. 4A and 4B illustrate a two-beam diffraction lithographic projection apparatus for line printing, according to one embodiment of the present invention.
Figure 4B:
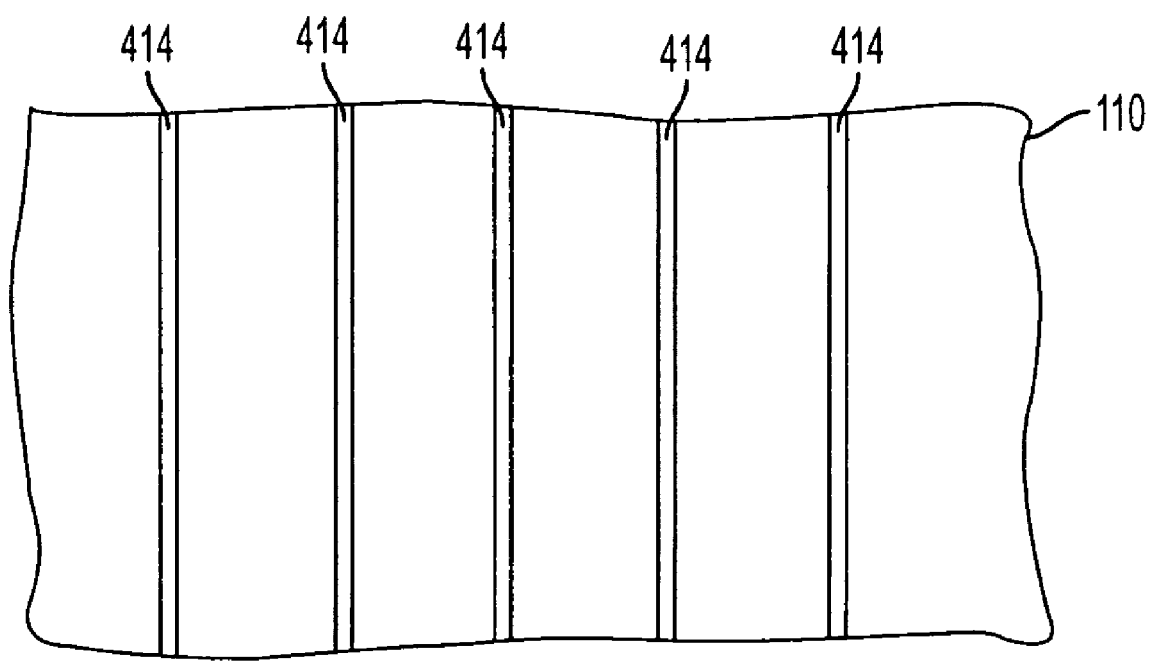

FIGS. 4A and 4B illustrate a two-beam diffraction lithographic projection apparatus for line printing, according to one embodiment of the present invention. Similar elements as those discussed above are shown with similar reference numerals. In this embodiment, a grating 404 is used for beamsplitter 104. As seen in FIG. 4B, lines 414 may be printed on substrate 110 through interfering of beams 106A and 106B.

Figure 5A:
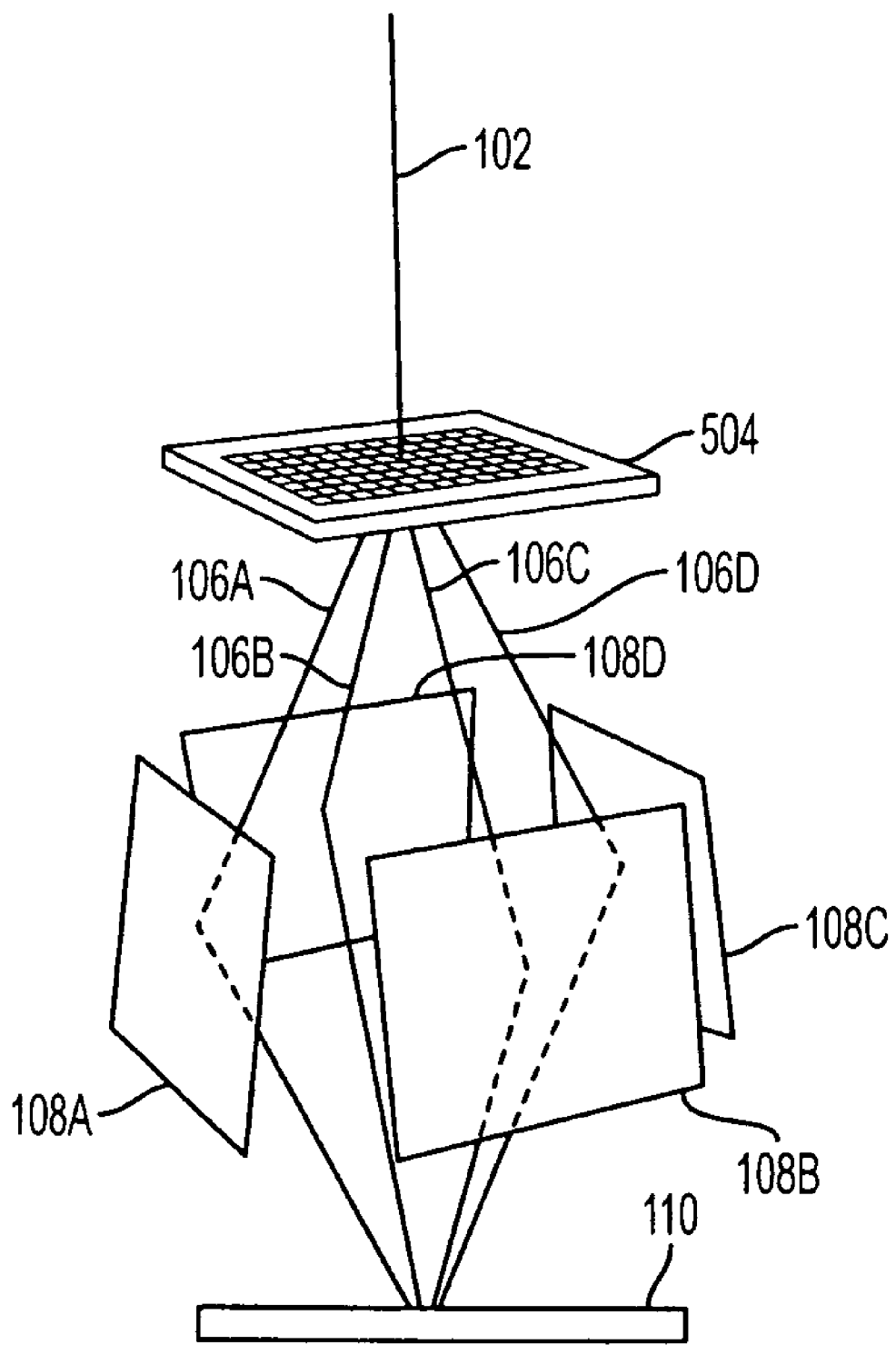
FIGS. 5A and 5B illustrate a four-beam diffraction lithographic projection apparatus to produce contact exposure patterns, according to one embodiment of the present invention.
Figure 5B:
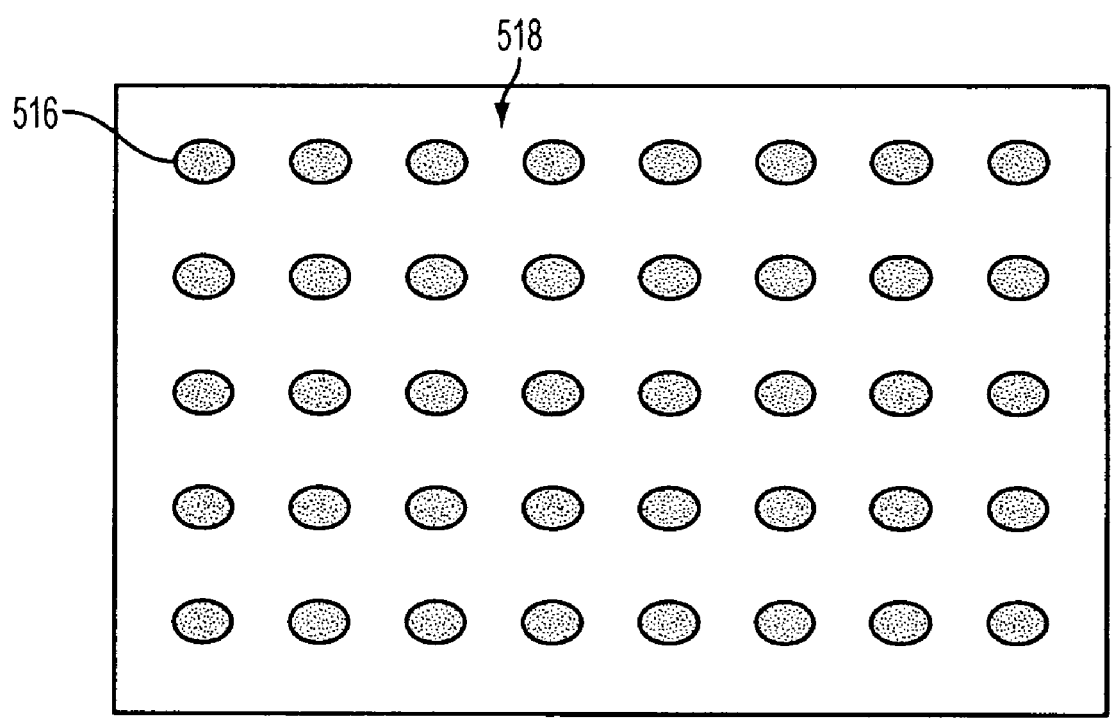

FIGS. 5A and 5B illustrates the use of a four-beam diffraction lithographic projection apparatus to produce contact exposure patterns, according to one embodiment of the present invention. In this embodiment, a grating 504 is used for beamsplitter 104 to produce four beams 106A to 106D that are reflected from four respective reflecting surfaces 108A to 108D. As seen in FIG. 5B, contact holes 516 form a contact hole pattern 518 on substrate 110 through interfering of beams 106A to 106D. In one example, the pitch of the beams may not be the same. For example, one set of opposite beams can have a different pitch from another set of opposite beams, in a four-beam projection apparatus. This allows for printing of contact holes that are not only square-shaped (or square-shaped with rounded corners, since perfect corners are generally difficult to achieve), but also rectangular, oval shaped, etc. The reflective surfaces may be formed on a prism so that the position of the reflective surfaces with respect to each other is very stable ensuring a good and stable alignment of the reflective surfaces.

FIGS. 6A-6D illustrate exemplary respective gratings 104A to 104D that may be used as beam splitter 104, according to various embodiments of the present invention. All of these are examples of a checkerboard gratings, and may be used to generate the four-way symmetric beams, that will interfere at the wafer 110 to produce the contact hold pattern. FIG. 6A illustrates a glass plate 104A with chrome checkerboard pattern. FIG. 6B illustrates a glass plate 104B with etched phase pattern. FIG. 6C illustrates a glass plate 104C with a chrome basket weave pattern. FIG. 6D illustrates a glass plate 104D with an etched face basket weave pattern. The gratings 104C and 104D shown in FIGS. 6C and 6D may be less sensitive to overexposure and underexposure of the photoresist.

In one example, a pitch of the gratings 104A to 104D, such as those shown in FIGS. 6A-6D, is on the order of one or two microns, although the exact pitch depends on the desired resolution, the other optical components in the lithographic projection apparatus, etc. It will be understood by one of ordinary skill in the art that the invention is not limited to any particular checkerboard grating geometry, or any particular grating pitch, since those are designed parameters readily calculated by an optics designer.

FIG. 7 illustrates an exemplary lithographic projection apparatus 700 where the gratings 104A to 104D of respective FIGS. 6A-6D may be used, according to one embodiment of the present invention. Again, similar elements to those described above are shown with similar element numbers. Projection apparatus 700 includes an illumination system 720 that conditions a beam of radiation 102 and directs the beam 102 onto interchangeable upper optics module 204. Gratings 104A to 104D would be in alternative upper optic modules 204A to 204D, which would be interchangeable, as discussed above, under control of a controller 722. Such a projection apparatus provides for the rapid change of various parameters, such as resolution, pattern features, contact hole shapes, etc. under computer control, by swapping the appropriate interchangeable optical upper modules 204A to 204D in and out. It also provides, in an immersion lithography variant using an immersion lithography projection apparatus 724, which can be used for automated dispensing and recovery of the immersion liquid 210, as would be known to skilled artisans, which can then be chemically analyzed. Furthermore, the lithographic projection apparatus provides for a defined exposure field (for example, an approximately square-shaped exposure field), with a substantially uniform exposure over the entire exposure field.

It is to be appreciated that although four variants for beamsplitter 104 and interchangeable upper optics module 204 are discussed, any number of variants are contemplated within the scope of the present invention.

In one example, as it is generally difficult to use conventional glass at such short wavelengths (e.g., 193 nm, 157 nm), and specialty glasses, such as fused silica or quartz, are normally used for deep ultraviolet applications.

Note that although the discussion herein is primarily in terms of printing line patterns and contact hole patterns, it is also possible to use this process in the manufacturing of actual semiconductor circuits, for example, when a patterned layer (one of many layers needed in the course of building up a complex semiconductor circuit) has to be formed. For example, such a patterned layer may be used to reduce the dielectric coupling between two other layers on a wafer.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic projection apparatus, comprising:
   an illumination system configured to condition a beam of radiation;
   an interchangeable upper optics module configured to receive the beam and comprising a beam splitter configured to split the beam into multiple beam portions that are not afterward substantially diffracted; and
   a lower optics module configured to receive the beam portions and direct the beam portions onto a same location on a substrate so as to create an interference pattern on a radiation-sensitive surface of the substrate, the interference pattern comprising a periodic series of intensity minima and maxima arising from interference between the beam portions,
   wherein the interchangeable upper optics module comprises a reflecting surface configured to direct the beam portions toward the same location and the interchangeable upper optics module is interchangeable for a different interchangeable upper optics module so as to change the interference pattern.

2. The lithographic projection apparatus of claim 1, wherein the beamsplitter is configured to split the beam into multiple beam portions by diffracting zeroth, first and second order diffraction beams.

3. The lithographic projection apparatus of claim 1, wherein the beamsplitter is configured to split the beam into multiple beam portions by diffracting zeroth, first and second order diffraction beams and the interchangeable upper optics module is provided with an aperture plate to block the zeroth order diffraction beam.

4. The lithographic projection apparatus of claim 1, wherein the interchangeable upper optics module is provided with an aperture plate to block unwanted beam portions.

5. The lithographic projection apparatus of claim 1, further comprising:
   an automated fluid dispensing system to dispense an immersion liquid between the lower optics module and the substrate.

6. The lithographic projection apparatus of claim 1, wherein the beamsplitter comprises a phase shifting beamsplitter.

7. The lithographic projection apparatus of claim 1, wherein the beamsplitter comprises a linear grating.

8. The lithographic projection apparatus of claim 1, wherein the beamsplitter comprises a checkerboard grating.

9. The lithographic projection apparatus of claim 8, wherein the checkerboard grating comprises a phase shifted checkerboard grating.

10. The lithographic projection apparatus of claim 1, wherein the beamsplitter comprises a basket weave grating.

11. The lithographic projection apparatus of claim 1, wherein the beamsplitter comprises an etched face basket weave grating.

12. The lithographic projection apparatus of claim 11, wherein the etched face basket weave grating comprises a phase shifted checkerboard grating.

13. The lithographic projection apparatus of claim 1, wherein the lower optics module comprises a prism.

14. The lithographic projection apparatus of claim 1, wherein the lower optics module is configured to direct four beam portions to form the interference pattern.

15. The lithographic projection apparatus of claim 14, wherein pairs of beam portions of the four beam portions have a different pitch.

16. The lithographic projection apparatus of claim 1, wherein the lower optics module is configured to direct two of the beam portions to form the interference pattern.

17. A lithographic projection apparatus, comprising:
    an illumination system configured to condition a beam of radiation;
    an interchangeable upper optics module configured to receive the beam and comprising a beam splitter configured to split the beam into multiple beam portions that are not afterward substantially diffracted; and
    a lower optics module configured to receive four beam portions and direct the beam portions onto a same location on a substrate so as to create a two dimensional interference pattern on a radiation-sensitive surface of the substrate, the interference pattern comprising a periodic series of intensity minima and maxima arising from interference between the beam portions;
    wherein the interchangeable upper optics module comprises a reflecting surface configured to direct the beam portions toward the same location and the interchangeable upper optics module is interchangeable for a different interchangeable upper optics module so as to change the interference pattern.

18. A method of using the projection apparatus of claim 17 to direct the beam portion with the lower optics module to form a contact hole pattern.

19. The method according to claim 18 wherein the contact hole pattern comprises rectangular contact holes.

20. The method according to claim 18 wherein the contact hole pattern comprising oval contact holes.

21. The lithographic projection apparatus of claim 17 wherein the reflecting surface is provided on a prism.

22. A lithographic projection apparatus, comprising:
    an illumination system configured to condition a beam of radiation;
    a plurality of interchangeable upper optics modules configured to be swapped into a path of the beam under computer control, each interchangeable upper optics module comprising a beam splitter configured to split the beam into multiple beam portions that are not afterward substantially diffracted; and
    a lower optics module configured to receive the beam portions and direct the beam portions onto a same location on a substrate so as to create an interference pattern on a radiation-sensitive surface of the substrate, the interference pattern comprising a periodic series of intensity minima and maxima arising from interference between the beam portions,
    wherein at least one interchangeable upper optics module comprises a reflecting surface configured to direct the beam portions toward the same location and the at least one interchangeable upper optics module is interchangeable for a different interchangeable upper optics module so as to change the interference pattern.

23. The projection apparatus of claim 22, further comprising:

an automated fluid dispensing and recovery system to dispense and recover fluid from between the lower optics module and the substrate.

24. The projection apparatus of claim 22, wherein each of the plurality of interchangeable upper optics modules is configured to produce a different resolution of a contact hole pattern.

25. The projection apparatus of claim 22, wherein each of the plurality of interchangeable upper optics modules is configured to produce a different contact hole shape of a contact hole pattern.

* * * * *